(12) United States Patent
Hung et al.

(10) Patent No.: US 10,608,045 B2
(45) Date of Patent: Mar. 31, 2020

(54) METHOD OF FORMING SEMICONDUCTOR DEVICE

(71) Applicant: UNITED MICROELECTRONICS CORP., Hsin-Chu (TW)

(72) Inventors: Ching-Wen Hung, Tainan (TW); Yu-Ping Wang, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/297,698

(22) Filed: Mar. 10, 2019

(65) Prior Publication Data

US 2019/0273117 A1 Sep. 5, 2019

Related U.S. Application Data

(62) Division of application No. 15/936,377, filed on Mar. 26, 2018, now Pat. No. 10,276,633.

(30) Foreign Application Priority Data

Mar. 2, 2018 (CN) .......................... 2018 1 0173968

(51) Int. Cl.
| | | |
|---|---|---|
| H01L 27/22 | (2006.01) |
| H01L 23/522 | (2006.01) |
| H01L 43/02 | (2006.01) |
| H01L 23/528 | (2006.01) |
| H01L 43/08 | (2006.01) |
| H01L 43/12 | (2006.01) |
| H01F 10/32 | (2006.01) |
| H01F 41/34 | (2006.01) |
| G11C 11/16 | (2006.01) |

(52) U.S. Cl.
CPC .......... *H01L 27/222* (2013.01); *G11C 11/161* (2013.01); *H01F 10/3254* (2013.01); *H01F 41/34* (2013.01); *H01L 23/528* (2013.01); *H01L 23/5226* (2013.01); *H01L 43/02* (2013.01); *H01L 43/08* (2013.01); *H01L 43/12* (2013.01); *H01F 10/329* (2013.01)

(58) Field of Classification Search
CPC ................................................... H01F 10/3254
See application file for complete search history.

(56) References Cited

U.S. PATENT DOCUMENTS

| | | |
|---|---|---|
| 9,362,490 B1 | 6/2016 | Xiao |
| 9,818,935 B2 | 11/2017 | Chuang et al. |
| 2018/0197591 A1 | 7/2018 | Stainer |

*Primary Examiner* — Walter H Swanson
(74) *Attorney, Agent, or Firm* — Winston Hsu

(57) ABSTRACT

A semiconductor device and method of forming the same, the semiconductor device includes a substrate, first plug, a magnetoresistive random access memory (MRAM) structure, a spacer layer, a seal layer and a first conductive pattern. The substrate has a first region and a second region, and the first plug is disposed on a dielectric layer disposed on the substrate, within the first region. The MRAM structure is disposed in the dielectric layer and electrically connected to the first plug. The spacer layer is disposed both within the first region and the second region, to cover the MRAM structure. The seal layer is disposed on the MRAM structure and the first plug, only within the first region. The first conductive pattern penetrates through the seal layer to electrically connect the MRAM structure.

7 Claims, 6 Drawing Sheets

METHOD OF FORMING SEMICONDUCTOR DEVICE

CROSS REFERENCE TO RELATED APPLICATIONS

This application is a Divisional of application Ser. No. 15/936,377 filed Mar. 26, 2018, and included herein by reference.

BACKGROUND OF THE INVENTION

1. Field of the Invention

The present invention relates to a semiconductor device and a method of forming the same, and more particularly, to a semiconductor device having a magnetoresistive random access memory, (MRAM) structure and a forming method thereof.

2. Description of the Prior Art

Magnetoresistive random access memory (MRAM) is a non-volatile computer memory technology, and is about six times faster than the current industry-standard memory, dynamic RAM (DRAM). Since the MRAM usually include functions like high speed data transmission, high density, light size, low power consumption and impact resistance, it is particularly suitable to apply to advanced portable electronic products, such as smart mobile phones.

Unlike these technologies, MRAM uses magnetism instead of electrical charges to store data. In general, the MRAM cells include a data layer and a reference layer. The data layer is composed of a magnetic material and during a write operation the magnetization of the data layer can be switched between two opposing states by an applied magnetic field and thus binary information can be stored. The reference layer usually is composed of a magnetic material in which the magnetization is pinned so that the magnetic field, which is applied to the data layer and in part penetrates the reference layer, is of insufficient strength to switch the magnetization in the reference layer. Unlike the DRAM, the MRAM does not require a transistor for the write operation. It is generally believed that MRAM will have to move to the 65 nm size of the most advanced memory devices, which will require the use of spin-torque-transfer (STT) technology.

However, the prior art MRAM still has several drawbacks. Therefore, there is a need in this industry to provide an improved method for fabricating the MRAM devices in order to avoid the aforementioned problems.

SUMMARY OF THE INVENTION

One of the objectives of the present invention provides a semiconductor device, in which a seal layer is additionally deposed on the magnetoresistive random access memory (MRAM) structure, thereby using the seal layer to protect the MRAM structure underneath. That is, it is sufficient to avoid the short circuit issue between the magnetic tunneling junction (MTJ) of the MRAM structure and the conductive pattern disposed thereon. Then, the semiconductor device may therefore gain a better structure so as to improvement the device performance thereof.

Another objective of the present invention further provides a method of forming a semiconductor device, in which a seal layer is additionally formed on the MRAM structure, to protect the MRAM structure disposed underneath. In this way, the seal layer may be used to avoid the exposure of the MRAM structure during the subsequent forming processes of the conductive patterns caused by excess etching, as well as the possible short circuit issue between the MTJ of the MRAM structure and the conductive pattern disposed thereon during the subsequent process of conducting the conductive pattern. That is, a semiconductor device with better structure may be obtained via a simplify process.

To achieve the purpose described above, one embodiment of the present invention provide a substrate, a first plug, a MRAM structure, a spacer layer, a seal layer and a first conductive pattern. The substrate includes a first region and a second region, and the first plug is disposed in the dielectric layer on the substrate, within the first region. The spacer layer is dispose both within the first region and the second region, to cover the MRAM structure, and a seal layer is dispose on the MRAM structure and the spacer layer, only within the first region. The first conductive pattern penetrates through the seal layer to electrically connect the MRAM structure.

To achieve the purpose described above, another embodiment of the present invention provides a method of forming a semiconductor device, including the following steps. First of all, a substrate is provided to include a first region and a second region, and a first dielectric layer is formed to cover both of the first region and the second region. Then, a first plug is formed in the first dielectric layer, within the first region, and a MRAM structure is formed on the first dielectric layer, within the first region to electrically connect the first plug. Next, a spacer layer is formed to cover sidewalls of the MRAM structure and the spacer layer within the second region, and a second dielectric layer is formed on the spacer layer. Following these, a seal layer is formed on the second dielectric layer, the seal layer only disposed within the first region. Finally, a first conductive pattern is formed in a third dielectric layer on the seal layer, and the first conductive pattern penetrates through the seal layer to electrically connect the MRAM structure.

Overall speaking, the method of present invention firstly forms a spacer layer that covers the sidewalls of the MRAM structure and both of the two regions, and then forms a seal layer that covers only one of the two regions and the top surface of the MRAM structure. Then, the seal layer is used to protect the MRAM structure underneath, to prevent the MRAM structure from being damage by excess etching of the MRAM structure during the subsequent forming process of the conductive patterns or by excess shrinking the spacer layer on the MRAM structure. Therefore, it is sufficient to avoid possible short circuit issue between the MRAM structure and the conductive patterns, so as to obtain the semiconductor device with a better structure, for achieving better performance thereof.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a semiconductor device according to a first preferred embodiment of the present invention, wherein:

FIG. 1 shows a cross-sectional view of a semiconductor device after forming a MRAM structure;

FIG. 2 shows a cross-sectional view of a semiconductor device after forming a seal layer;

FIG. 3 shows a cross-sectional view of a semiconductor device after performing a patterning process;

FIG. 4 shows a cross-sectional view of a semiconductor device after forming a dielectric layer;

FIG. 5 shows a cross-sectional view of a semiconductor device after forming a conductive patter.

FIG. 6 to FIG. 10 are schematic diagrams illustrating a method of forming a semiconductor device according to a second preferred embodiment of the present invention, wherein:

FIG. 6 shows a cross-sectional view of a semiconductor device after performing an etching back process;

FIG. 7 shows a cross-sectional view of a semiconductor device after forming a seal layer;

FIG. 8 shows a cross-sectional view of a semiconductor device after performing a patterning process;

FIG. 9 shows a cross-sectional view of a semiconductor device after forming a dielectric layer;

FIG. 10 shows a cross-sectional view of a semiconductor device after forming a conductive pattern.

DETAILED DESCRIPTION

To provide a better understanding of the presented invention, preferred embodiments will be described in detail. The preferred embodiments of the present invention are illustrated in the accompanying drawings with numbered elements.

Figure 1:
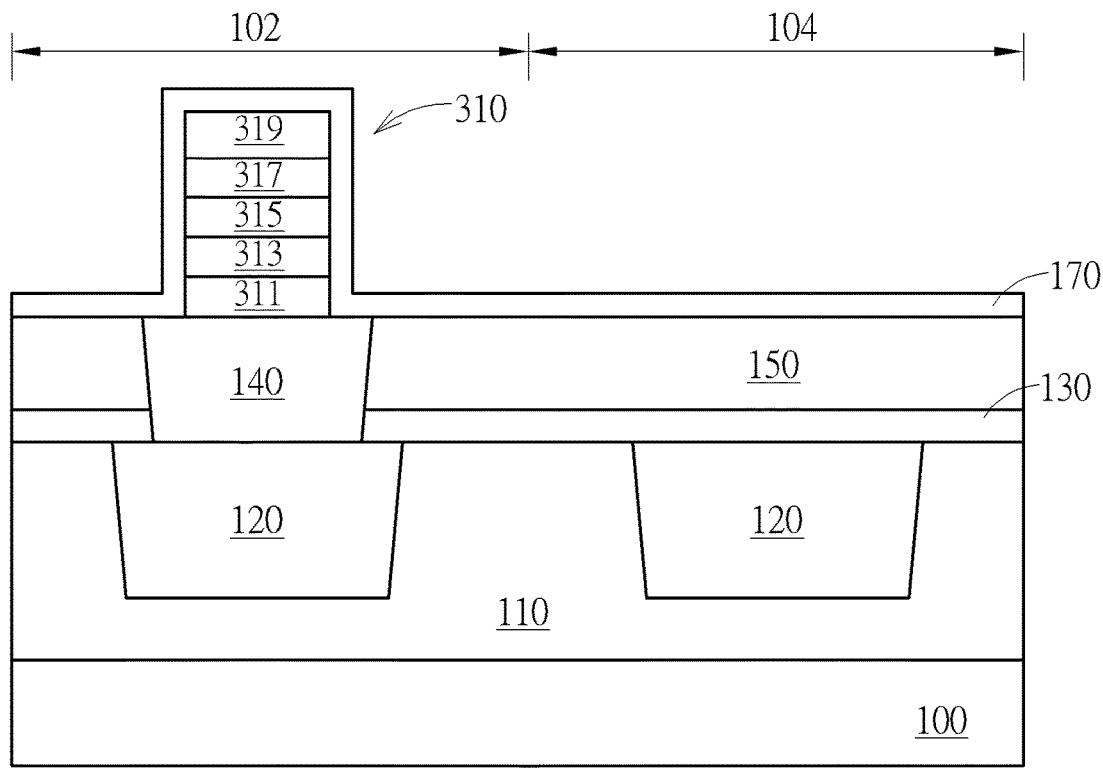

Please refer to FIG. 1 to FIG. 5, which are schematic diagrams illustrating steps of a method for forming a semiconductor device in the first preferred embodiment of the present invention. Firstly, a substrate 100 for example a semiconductor substrate like a silicon substrate, a silicon-containing substrate, an epitaxial silicon substrate or a silicon-on-insulator substrate, is provided, and two regions 102, 104 are defined on the substrate 100. The two regions 102, 104 maybe serve as a cell region and an edge region respectively, but not limited to this. The substrate 100 further includes a plurality of conductive patterns 120 formed thereon, and the conductive patterns 120 are disposed within the two regions 102, 104 respectively. The conductive patterns 120 maybe any conductive element or metal contact, for example, a metal line disposed in a dielectric layer 110, as shown in FIG. 1.

Then, a plug 140 and a magnetoresistive random access memory (MRAM) structure 310 are sequentially formed in the region 102 of the substrate 100 to electrically connect to the conductive pattern 120 in the region 102. In the present embodiment, the plug 140 is formed in a dielectric layer 150 and a stop layer 130 stacked one over another on the substrate 100. The stop layer 130 is disposed between the two dielectric layers 110, 150, and includes a dielectric material like silicon oxynitride (SiON) or silicon carbonitride (SiCN), so as to function like an etch stop layer in the etching process for forming the plug 140. The MRAM structure is formed on the plug, to electrically connect to the conductive pattern 120 underneath through the plug 140.

As shown in FIG. 1, the MRAM structure 310 includes a bottom electrode layer 311 for example including a metal material like tantalum (Ta), a magnetic tunneling junction (MTJ) and a top electrode layer 319 for example including a different metal material from that of the bottom electrode layer 311, stacked one over another on the substrate 100. The MJT is disposed between the bottom electrode layer 311 and the top electrode layer 319, and at least includes a seed layer (not shown in the drawings) for example including a material like platinum (Pt), an anti-magnetic pinning layer (not shown in the drawing) for example including a material like cobalt (Co)/platinum, a reference layer 313 for example including a magnetic material like tantalum or cobalt-iron-boron (CoFeB), a tunneling layer 315 for example including a material like manganese oxide (MgO), a free layer 317 for example including a magnetic material like tantalum or cobalt-iron-boron, and a capping layer (not shown in the drawings) for example including a material like manganese oxide, stacked from bottom to top. In this embodiment, the reference layer 313 and the free layer 317 preferably include a multilayer structure, for example, the reference layer 313 may include a tantalum film (not shown in the drawings) and a cobalt-iron-boron film (not shown in the drawings) stacked one over another, and the free layer 317 may include a bottom cobalt-iron-boron film (not shown in the drawings), a tantalum film (not shown in the drawings) and a top cobalt-iron-boron film (not shown in the drawings) stacked one over another, but is not limited to this. Then, a spacer layer 170 is formed to cover both of the two regions 102, 104, and to cover on the MRAM structure 310.

Figure 2:
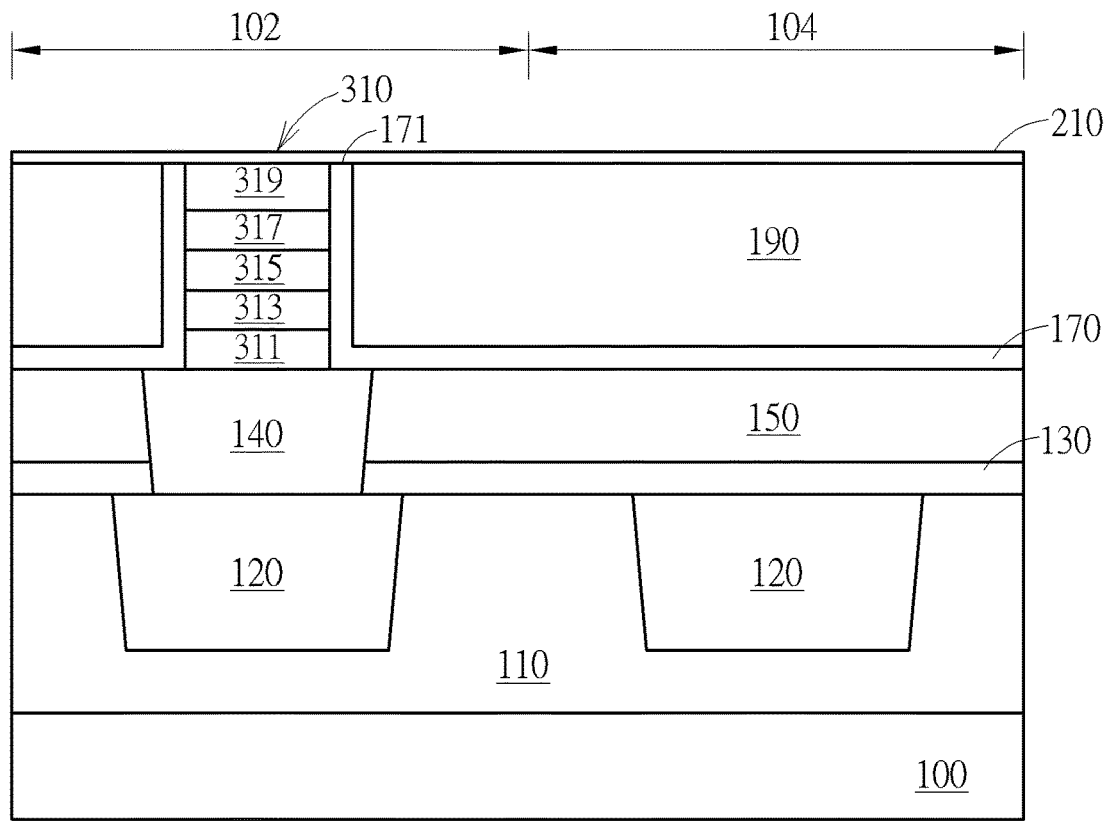

Next, a dielectric layer 190 and a seal layer 210 are sequentially formed, to cover both of the two regions 102, 104. Precisely speaking, after forming the spacer layer 170, a dielectric material layer (not shown in the drawings) is firstly formed, to entirely cover the substrate, including the two regions 102, 104 thereof, and a planarization process such as an etching process or a chemical mechanical polishing (CMP) process is performed, to partially remove the dielectric material layer and the spacer layer 170 till the exposure of a top surface of the MRAM structure 310. At the meantime, the dielectric layer 190 which is level with the top surface of the MRAM structure 310 is obtained, and a top surface 171 of the spacer layer 170 is also obtained to level with the dielectric layer 190, as shown in FIG. 2. Then, the seal layer 210 is formed to cover the MRAM structure 310 disposed within the region 102 and the dielectric layer 190 disposed within the region 104.

Figure 3:
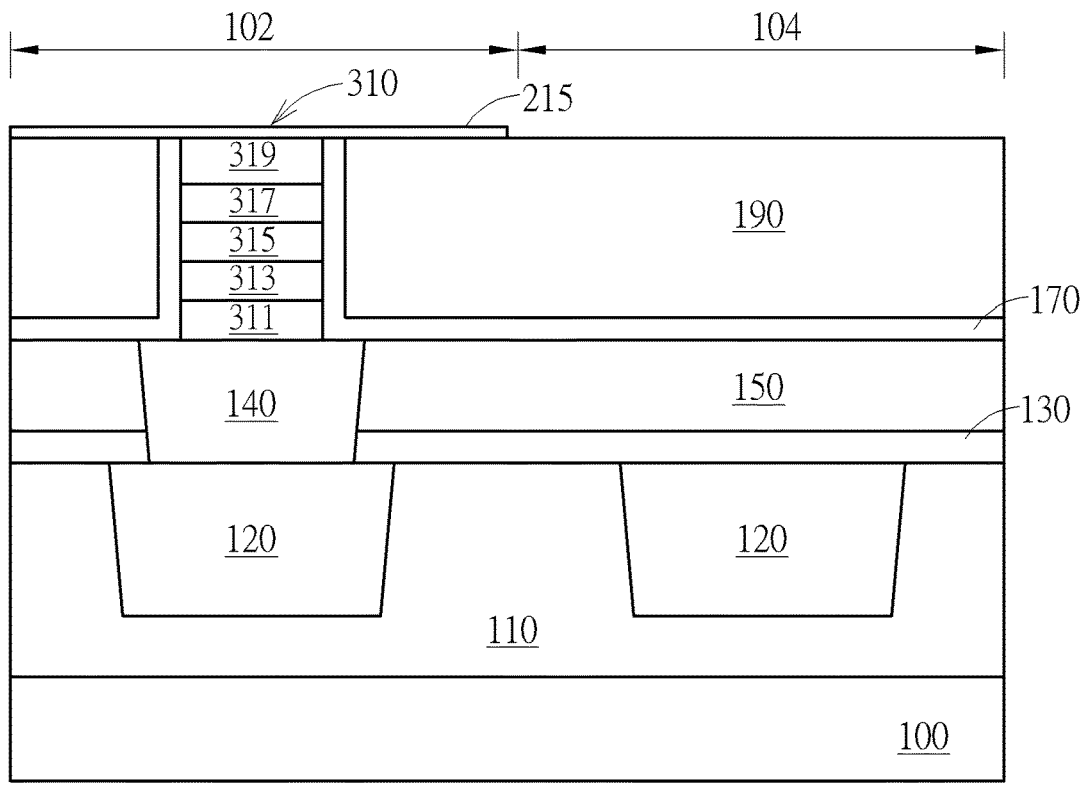
Figure 4:
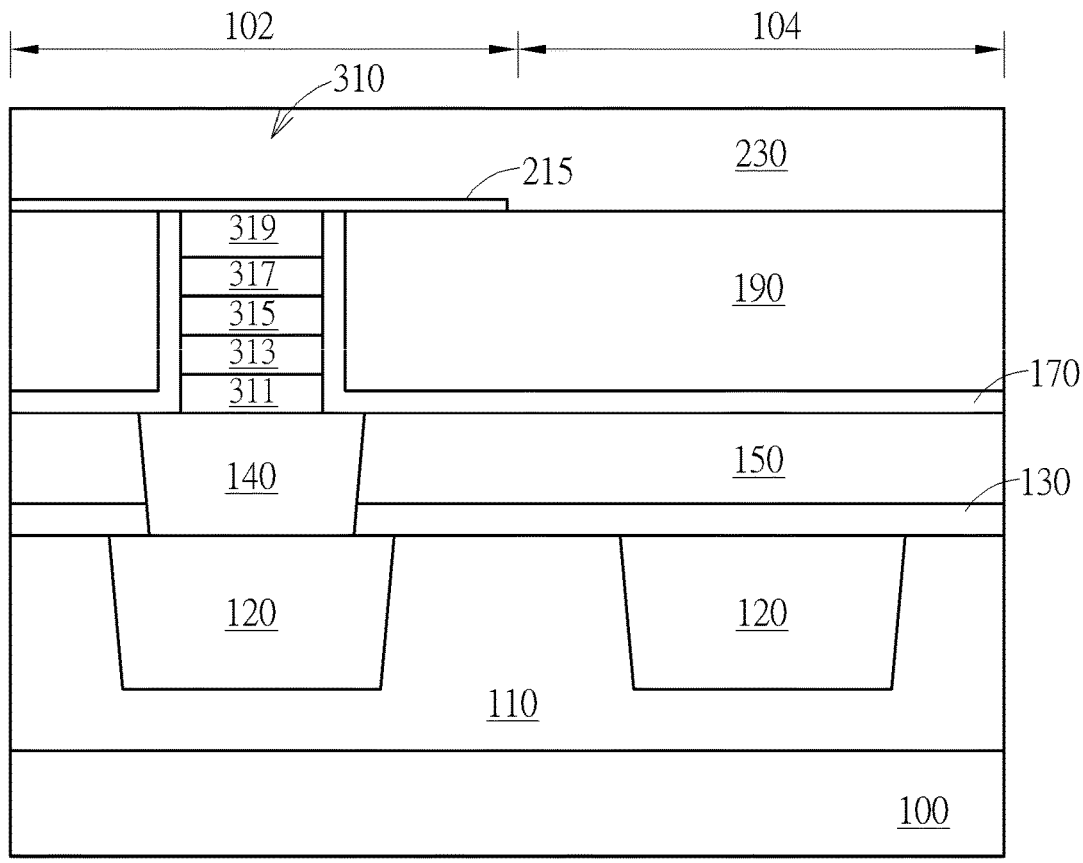

As shown in FIG. 3, a patterning process is performed to remove the seal layer 210 covering in the region 104, to form a seal layer 215. The seal layer 215 only disposed within the region 102, to cover the MRAM structure and a portion of the dielectric layer 190. Then, a dielectric layer 230 is formed on the substrate 100, covering both of the two regions 102, 104. It is noted that, although the dielectric layer 230 covers on the seal layer 215, the dielectric layer 230 still has a planar top surface, as shown in FIG. 4.

After that, conductive patterns 330, 320 are respectively formed within the two regions 102, 104, to electrically connect to the conductive patterns 120. In the region 104, the conductive pattern 320 is formed in the dielectric layer 230, the dielectric layer 190, the spacer layer 170, the dielectric layer 150 and the stop layer 130, to penetrate through the spacer layer 170 to directly electrically connect to the conductive pattern 120 in the dielectric layer 110. In the present embodiment, the conductive pattern 320 for example includes a dual damascene structure, and which includes a plug structure 320*b* being disposed in the spacer layer 170 the dielectric layer 150 and the stop layer 130, and wire structure 320*a* being disposed in the dielectric layer 230 and the dielectric layer 190, as shown FIG. 5. The formation of the conductive pattern 320 is accomplished by performing a via first dual damascene process, which includes first defining a via hole (not shown in the drawings) or a contact hole (not shown in the drawings) in the dielectric layer 230, the dielectric layer 190, the spacer layer 170, the dielectric layer 150 and the stop layer 130 through a patterned mask, then, etching the dielectric layer 230 and the dielectric layer 190 through another patterned mask (not shown in the drawings) to form a trench (not shown in the drawings) being partially overlapped with the via hole or the contact hole, and performing a deposition and etching process to form a barrier layer 321 and a metal layer 323 in the trench and the via hole or the contact hole. The barrier layer 321 for example include a material like Ti/TiN or Ta/TaN, and the metal layer 323 for example include a low resistant metal like copper, but is not limited thereto.

Figure 5:
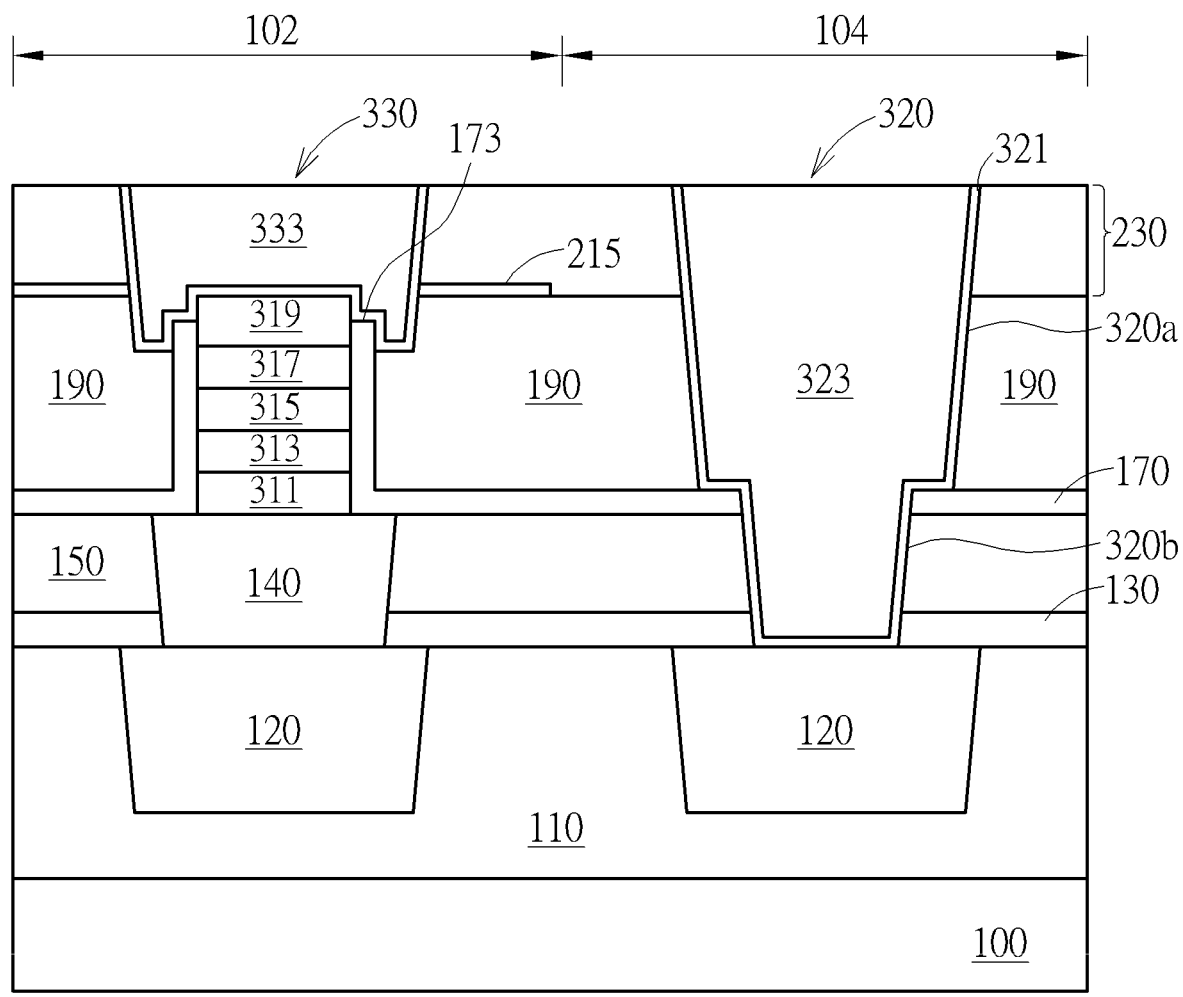

On the other hand, in the region 102, the conductive pattern 330 is formed in the dielectric layer 230 and the dielectric layer 190, to electrically connect the conductive pattern 120 underneath through the MRAM structure 310 and the plug 140, as shown in FIG. 5. The conductive pattern 330 for example includes a plug structure, and the forming method thereof may be integrated into the aforementioned dual damascene process, by etching the dielectric layer 230 and the dielectric layer 190 through another patterned mask (not shown in the drawings) to form another trench (not shown in the drawings) in the region 102 while forming the trench in the region 104, and performing the deposition and the etching process to form a barrier layer 331 and the metal layer 333 in the another trench. The barrier layer 331 for example include a material like Ti/TiN or Ta/TaN, and the metal layer 333 for example include a low resistant metal like tungsten or aluminum, but is not limited thereto.

In the present embodiment, the conductive pattern 330 penetrates through the seal layer 215 to electrically connect to the MRAM structure 310. Also, since the conductive pattern 330 includes a dimension greater than the diameter of the MRAM structure 310 underneath, the conductive pattern 330 may be directly in contact with the MRAM structure 310, and further covers a portion of the sidewalls (such as a portion of the sidewalls of the top electrode 319) of the MRAM structure 310, as shown in FIG. 5. Precisely speaking, while etching the dielectric layer 230, the dielectric layer 190 to form the trench, the etching depth thereof (namely the entire thickness of the dielectric layer 230 and the dielectric layer 190) is relative smaller than a depth of the trench within the region 104 (namely the entire thickness of the dielectric layers 230, 190, 150, the spacer layer 170 and the stop layer 130), so that, the spacer layer 170 disposed on the sidewalls of the MRAM structure 310 may also be etched. Accordingly, the top surface of the spacer layer 170 may therefore shrink, to obtain a top surface 173 being lower than the top surface of the MRAM structure 310. Under such situation, a portion of the sidewalls of the MRAM structure 310 (namely a portion of the sidewalls of the top electrode 319) may longer be covered by the spacer layer 170, so as being exposed thereform. Thus, the barrier layer 331 and the metal layer 333 formed in the subsequent process may also cover the exposed portion of the top electrode 319, as well as the top surface 173 of the spacer layer 170, thereby forming the conductive pattern 330.

It is noted that, the seal layer 215 preferably includes a material having a great etching selectivity related to the dielectric layers 230, 190, such as SiON or SiCN, to avoid any possible damages to the top electrode 319 of the MRAM structure 310 due to the excess etching during forming the trench. Meanwhile, the seal layer 215 may also avoid the excess shrinkage of the spacer layer 170 disposed on the sidewalls of the MRAM structure 310, thereby preventing more portion of the MRAM structure 310 being exposed therefrom. In other words, due to the protection of the seal layer 215, the top surface 173 of the shrunk spacing layer may still enable to cover the MTJ of the MRAM structure 310, to avoid the short circuit issue between the conductive pattern 330 and the MRAM structure 310 thereby. Thus the semiconductor device may therefore maintain a better performance.

Through the above processes, the forming method of the first preferable embodiment in the present invention is completed. According to the method of the present embodiment, the spacer layer 170 is formed on the substrate 100 to cover both of the two regions 102, 104, and to cover the sidewalls of the MRAM structure 310, and then, the seal layer 215 is formed only within the region 102, to cover the top surface of the MRAM structure 310. With this arrangement, the seal layer 215 may be used to protect the MRAM structure 310, so as to prevent the MRAM structure 310 from being damage by excess etching the top electrode 319 during the formation of the conductive pattern 330 or excess shrinking of the spacer layer 170 disposed on the sidewalls of the MRAM structure 310. That is, it is sufficient to avoid the possible short circuit issue between the MRAM structure 310 and the conductive pattern 330. Thus, the method of the present embodiment may efficient protect the MRAM structure 310, to avoid any possible damages during the formation of the conductive pattern 330, so as to obtain the semiconductor device with better performance.

People well known in the arts should easily realize the semiconductor device and the forming method thereof may further include other examples or variety, and is not limited to the aforementioned embodiment. For example, although the formation of the conductive pattern 320 is exemplified through the via first dual damascene process, the conductive pattern 320 may also be formed through a trench first dual damascene process or other dual damascene processes well known in the arts such as a self-aligned dual damascene process. Otherwise, the forming process of the plug structure 320b of the conductive pattern 320 may also be integrated with the forming process of the plug 140, for simultaneously forming the plug structure 320b and the plug 140. The following description will detail the different embodiments of the semiconductor device and the forming method thereof in the present invention. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIG. 6 to FIG. 10, which are schematic diagrams illustrating steps of a method for forming a semiconductor device in the second preferred embodiment of the present invention. The formal steps in the present embodiment are substantially similar to those in the first preferred embodiment, as shown in FIG. 1, and will not be redundantly described hereinafter. The differences between the present embodiment and the aforementioned first preferred embodiment are that, after forming the dielectric layer 190 leveled with the top surface of the MRAM structure 310, an etching back process is performed on the MRAM structure 310.

Figure 6:
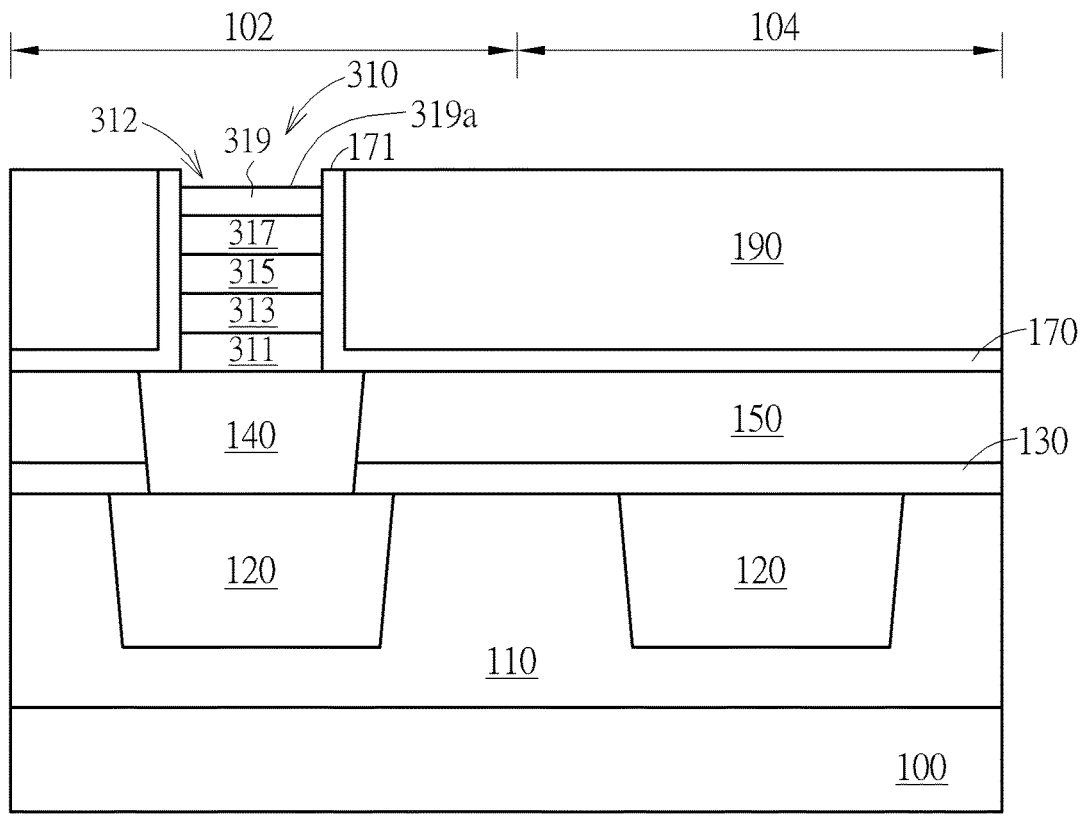

Precisely speaking, the etching back process for example a dry etching process or a wet etching process is performed to partially remove the top electrode 319 of the MRAM structure 310, so that the top electrode 319 may therefore obtain a top surface 319a being slight lower than the top surface 171 of the spacer layer 170 and the top surface of the dielectric layer 190, as shown in FIG. 6. Also, a trench 312 is formed between the top surface of the top electrode 319 and the top surface 171 of the spacer layer 170.

Figure 7:
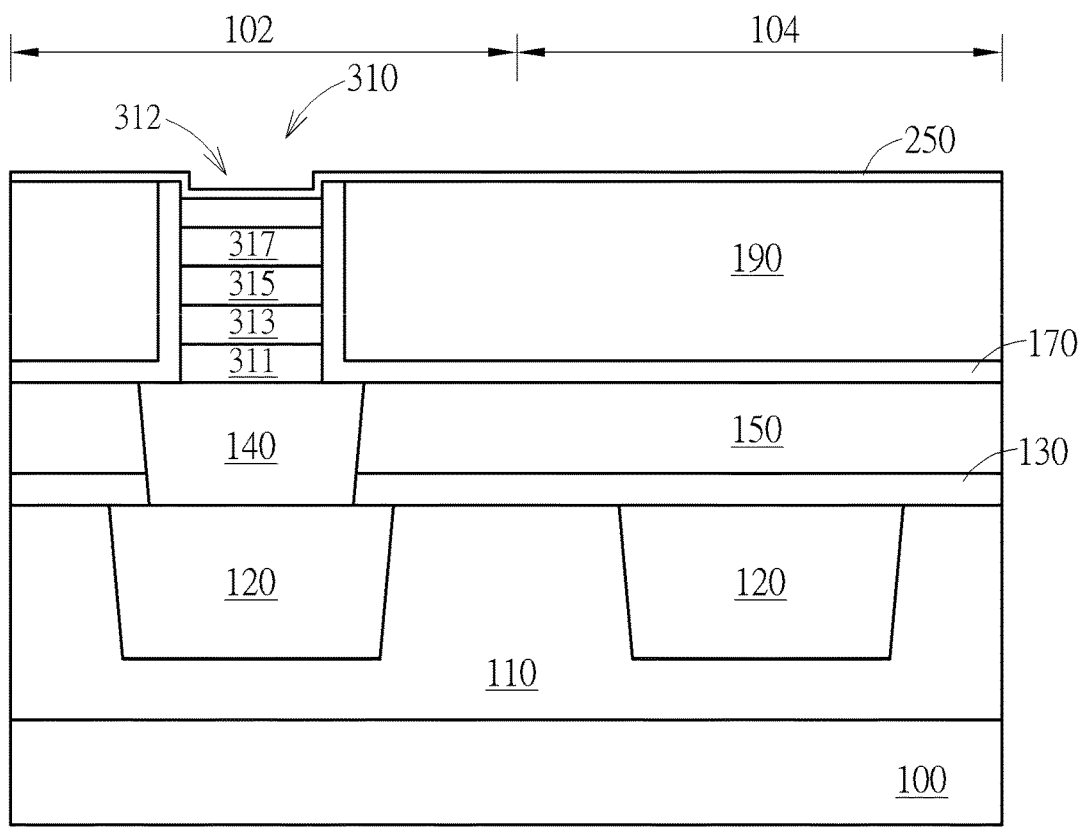
Figure 8:
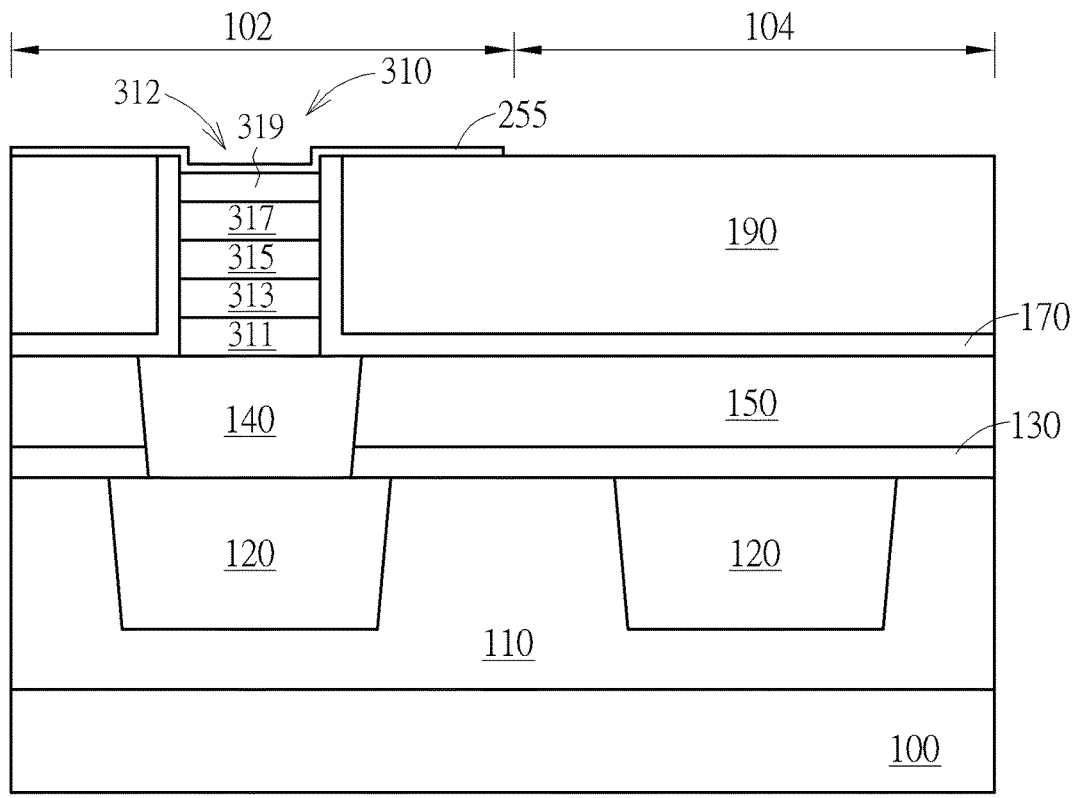
Figure 9:
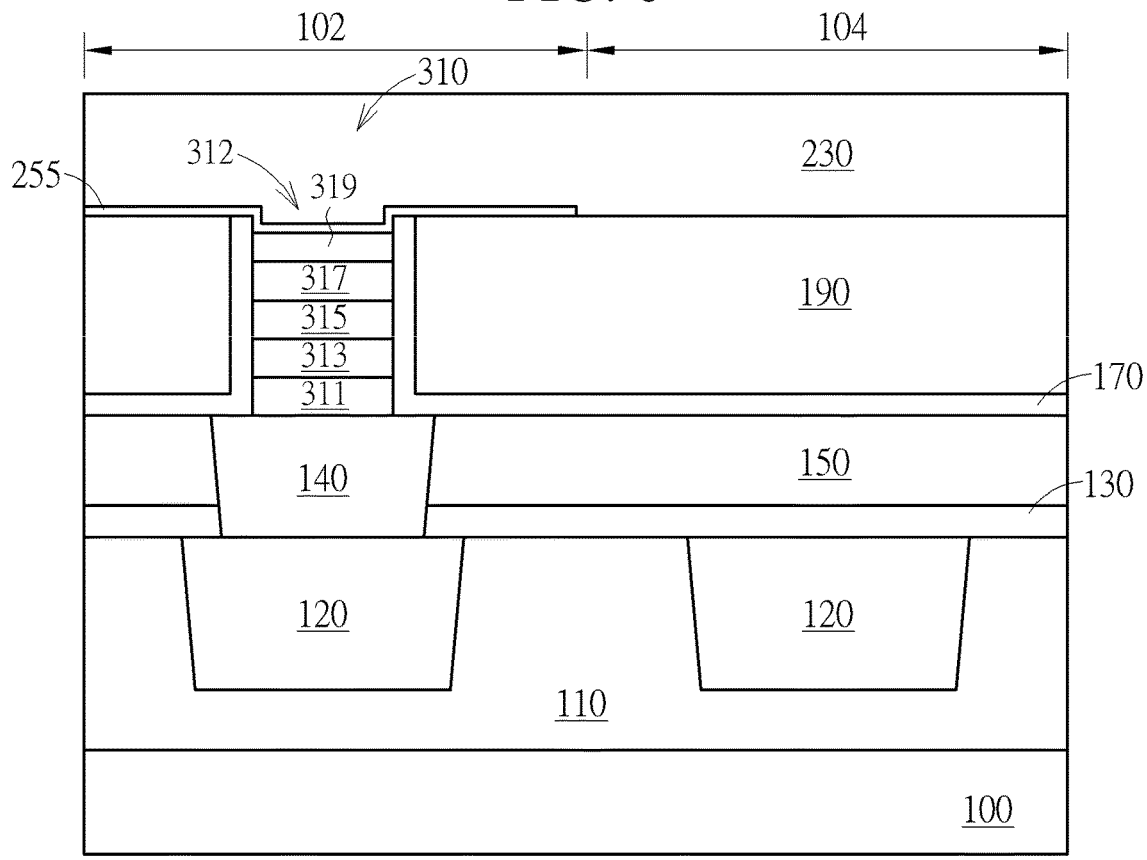

Then, as shown in FIG. 7, the seal layer 250 is formed on the substrate 100 to cover both of the two regions 102, 104. The seal layer 250 is conformally formed on the dielectric layer 190, the top surface 171 of the spacer layer 170, and the MRAM structure 310, to partially fill in the trench 312. Next, a patterning process is performed to remove the seal layer 250 covering on the region 104, to form a seal layer 255, as shown in FIG. 8. After that, the dielectric layer 230 is formed on the substrate 100, to cover both of the two regions 102, 104 and to fill in the trench 312. Although the dielectric layer 230 is formed on the seal layer 255, the dielectric layer 230 still has a planar top surface both within the two regions 102, 104, as shown in FIG. 9.

Figure 10:
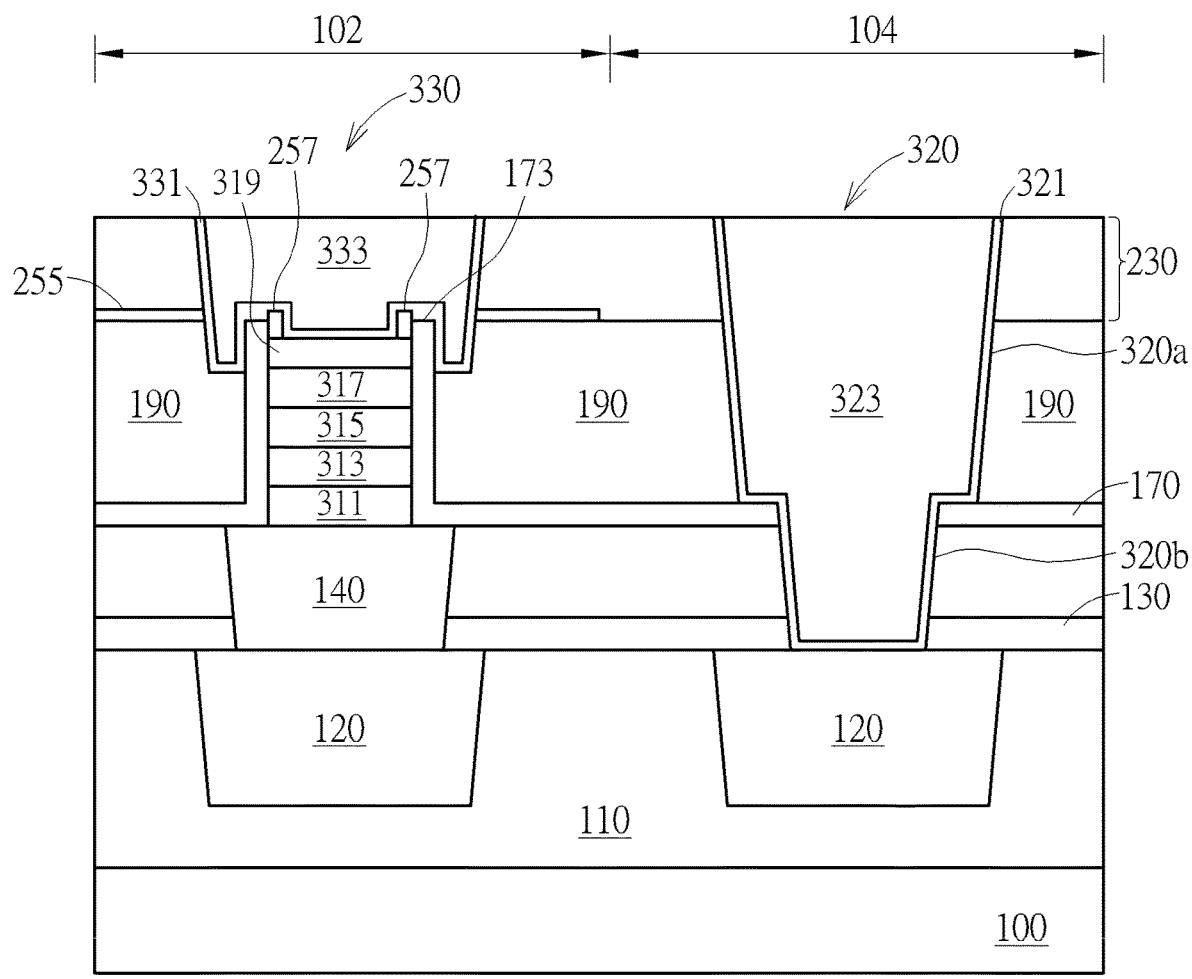

As shown in FIG. 10, conductive patterns 330, 320 are respectively formed within the two regions 102, 104, to electrically connect to the conductive patterns 120. Precisely, the conductive pattern 320 formed within the region 104 is directly electrically connected to the conductive pattern 120 in the dielectric layer 110, and the conductive pattern 330 formed within the region 102 is electrically connected to the conductive pattern 120 via the connection of the MRAM structure 310 and the plug 140 underneath. It is noted that, while forming the conductive pattern 330 which penetrates through the seal layer 255 to electrically connect the MRAM structure 310, the dielectric layers 230, 190 are firstly etched to form a trench (not shown in the drawings). Like what is described in the aforementioned first embodiment, the spacer layer 170 disposed on the sidewalls of the MRAM structure 310 may also be etched while forming the trench, so as to obtain a top surface 173 being lower than the top surface of the MRAM structure 310, and to partially expose the sidewalls of the MRAM structure 310 (namely, exposing a portion of the sidewalls of the top electrode 319). On the other hand, the seal layer 255 filled in the trench 312 may also be etched, so as to obtain two protruding portions 257 on the top surface of the MRAM structure 310, as shown in FIG. 10. In one embodiment, the protruding portions 257 are formed at one side of the spacer layer 170, and which include a top surface being higher than the top surface 173 of the spacer layer 170. In this way, the barrier layer 331 and the metal layer 333 formed in the subsequent processes may therefore cover on the top surface 173 of the spacer layer 170, the protruding portions 257 of the seal layer 255, and the exposed portion of the top electrode 319, thereby forming the conductive pattern 330.

Through the above processes, the forming method of the second preferable embodiment in the present invention is completed. According to the method of the present embodiment, the spacer layer 170 is firstly formed on the substrate 100 to cover both of the two regions 102, 104 and to cover the sidewalls of the MRAM structure 310, then, the top portion of the MRAM structure 310 is partially removed to form the trench 312, and the seal layer 255 is formed only within the region 102, to fill in the trench 312 and to cover the top surface of the MRAM structure 310. With this arrangement, the seal layer 255 may be used to protect the MRAM structure 310, so as to prevent the MRAM structure 310 from being damage by excess etching the top electrode 319 during the formation of the conductive pattern 330 or excess shrinking of the spacer layer 170 disposed on the sidewalls of the MRAM structure 310. That is, it is sufficient to avoid the possible short circuit issue between the MRAM structure 310 and the conductive pattern 330. Furthermore, the seal layer 255 may also be etched during the formation of the conductive pattern 330, to leave two protruding portions 257 remained on the top surface of the MRAM structure 310. The two protruding portions 257 may further protect the top electrode 319 of the MRAM structure in the subsequent processes. Thus, the method of the present embodiment may efficient protect the MRAM structure 310, to avoid any possible damages during the formation of the conductive pattern 330, so as to obtain the semiconductor device with better performance.

Overall speaking, the method of present invention firstly forms a spacer layer that covers the sidewalls of the MRAM structure and both of the two regions, and then forms a seal layer that covers only one of the two regions and the top surface of the MRAM structure. Then, the seal layer is used to protect the MRAM structure underneath, to prevent the MRAM structure from being damage by excess etching of the MRAM structure during the subsequent forming process of the conductive patterns or by excess shrinking the spacer layer on the MRAM structure. Therefore, it is sufficient to avoid possible short circuit issue between the MRAM structure and the conductive patterns, so as to obtain the semiconductor device with a better structure, for achieving better performance thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate, the substrate having a first region and a second region;
   forming a first dielectric layer on the substrate, covering the first region and the second region;
   forming a first plug in the first dielectric layer, within the first region;
   forming a magnetoresistive random access memory (MRAM) structure on the first dielectric layer within the first region, to electrically connect the first plug;
   forming a spacer layer covering sidewalls of the MRAM structure, the spacer layer within the first region and the second region;
   forming a second dielectric layer on the spacer layer;
   forming a seal layer on the second dielectric layer, only within the first region; and
   forming a first conductive pattern in a third dielectric layer on the seal layer, the first conductive pattern penetrated through the seal layer to electrically connect the MRAM structure.

2. The method of forming a semiconductor device according to claim 1, wherein the forming of the spacer layer comprises:
   forming a material layer covering the MRAM structure and the first dielectric layer; and
   performing a planarization process to expose a top surface of the MRAM structure from the material layer.

3. The method of forming a semiconductor device according to claim 2, further comprising:
   after the planarization process, performing an etching process to lower the top surface of the MRAM structure till being lower than a top surface of the spacer layer.

4. The method of forming a semiconductor device according to claim 3, wherein, after forming the first conductive pattern, the seal layer forms a protruding portion on the top surface of the MRAM structure.

5. The method of forming a semiconductor device according to claim 3, wherein the top surface of the spacer layer is higher than the top surface of the MRAM structure.

6. The method of forming a semiconductor device according to claim 1, wherein a top surface of the MRAM structure is higher than a top surface of the spacer layer after forming the first conductive pattern.

7. The method of forming a semiconductor memory device according to claim 1, further comprising:
   forming a second conductive pattern in the third dielectric layer, the second dielectric layer and the first dielectric layer.

\* \* \* \* \*